United States Patent [19]

Hashimoto

[11] Patent Number: 4,814,905

[45] Date of Patent: Mar. 21, 1989

[54] PORTABLE SOUND RECORDER AND PLAYBACK DEVICE WITH BATTERY SAVING FEATURE USING A SWITCH CONTROLLED TIMER

[75] Inventor: Kazuo Hashimoto, Tokyo, Japan

[73] Assignee: Hashimoto Corporation, Tokyo, Japan

[21] Appl. No.: 899,670

[22] Filed: Aug. 21, 1986

[30] Foreign Application Priority Data

Aug. 26, 1985 [JP] Japan ................. 60-187111

[51] Int. Cl.⁴ .............. G11B 15/20; G11B 15/03; G11B 15/10

[52] U.S. Cl. ................. 360/74.1; 360/69; 360/137; 369/19; 318/293; 377/15; 377/20; 328/129.1

[58] Field of Search .......... 360/12, 13, 69, 71, 360/74.1, 74.2, 137, 75, 73, 33.1; 318/293, 490; 369/19-23; 307/139-141; 328/129.1; 377/20, 15, 16

[56] References Cited

U.S. PATENT DOCUMENTS

| | | | |
|---|---|---|---|
| 2,286,345 | 6/1942 | Clausen | 369/19 |
| 3,939,361 | 2/1976 | Aidala et al. | 377/2 |
| 4,015,090 | 3/1977 | Kitada | 369/19 |
| 4,129,889 | 12/1978 | Ban et al. | 360/75 |
| 4,215,378 | 7/1980 | Sato et al. | 360/74.2 |
| 4,225,890 | 9/1980 | Takenaka et al. | 360/72.1 |
| 4,241,364 | 12/1980 | Shiga | 360/137 |
| 4,331,307 | 5/1982 | Furuta | 360/74.2 |
| 4,336,559 | 6/1982 | Koyama et al. | 360/73 |
| 4,540,851 | 9/1985 | Hashimoto | 360/33.1 |

FOREIGN PATENT DOCUMENTS

83/04362 12/1983 PCT Int'l Appl. .......... 360/33.1

Primary Examiner—Raymond F. Cardillo
Assistant Examiner—Steven R. Garland
Attorney, Agent, or Firm—Lowe, Price, Leblanc, Becker & Shur

[57] ABSTRACT

In a pocket size portable sound recorder, a special pushbutton swith is provided, and pulses are generated according to the number of operations of the pushbutton switch and are applied to a counter as upcount inputs. Also provided is a timer in which a pulse is generated whenever a specified time elapses after depression of the push button switch, and the pulse output is applied to the counter as a downcount input. Since the counter output is applied to the operation control circuit of the recorder, after the pushbutton switch is depressed, the recorder action will be carried out for a predetermined time period until the count value of the counter becomes zero. Also when the counter counts down to a predetermined value a flickering light is generated to indicate that the predetermined time is about to expire. If the special pushbutton is continuously depressed the counter is automatically reset to zero.

12 Claims, 4 Drawing Sheets

PORTABLE SOUND RECORDER AND PLAYBACK DEVICE WITH BATTERY SAVING FEATURE USING A SWITCH CONTROLLED TIMER

BACKGROUND OF THE INVENTION

1. Utilization of the Invention

The present invention relates to a portable tape recorder or a recording and play-back (or reproducing) equipment.

2. Prior Art

In recent years, remarkable technical progress has been made in portable tape recorders, but they still are not free from problems of inconvenience in practical use from the user's point of view.

Ordinarily, regarding the ON or OFF position of the pause switch provided in a portable tape recorder, if a user switches it to the ON position to save tape or battery for short time use, neither the motor nor the amplifier of the tape recorder performs any action, even though the recording push button switch or play-back pushbutton switch is manually actuated. However, if it is switched to the OFF position again, the tape recorder will continue to operate until tape end. Accordingly, the problem very often encountered with conventional pocket size portable tape recorders is that tape or battery may be already exhausted in the user's pocket even if he wants to use it next time.

SUMMARY OF THE INVENTION

An object of this invention is to solve the above described problem occurring at the time of short-time recording/reproducing by the provision of a portable pocket size tape recorder or the recording and play-back equipment in which, at the time of recording and play-back operation at user's discretion, even when the pause switch is in the ordinary ON state, the reproducing or recording operation is enabled only during a certain specified time period by the user merely momentarily depressing a separate pushbutton switch.

In order to solve the above described problem, this invention provides the portable recorder comprising means capable of performing ordinary operation, when the separate pushbutton switch or the like is depressed with the pause switch being placed in the ON state, thus allowing the portable recorder to perform the recording or reproducing operation for a predetermined time.

DETAILED DESCRIPTION OF THE INVENTION

The configuration and operation of a portable sound recorder according to the present invention will be described in connection with preferred embodiments.

Figure 1:
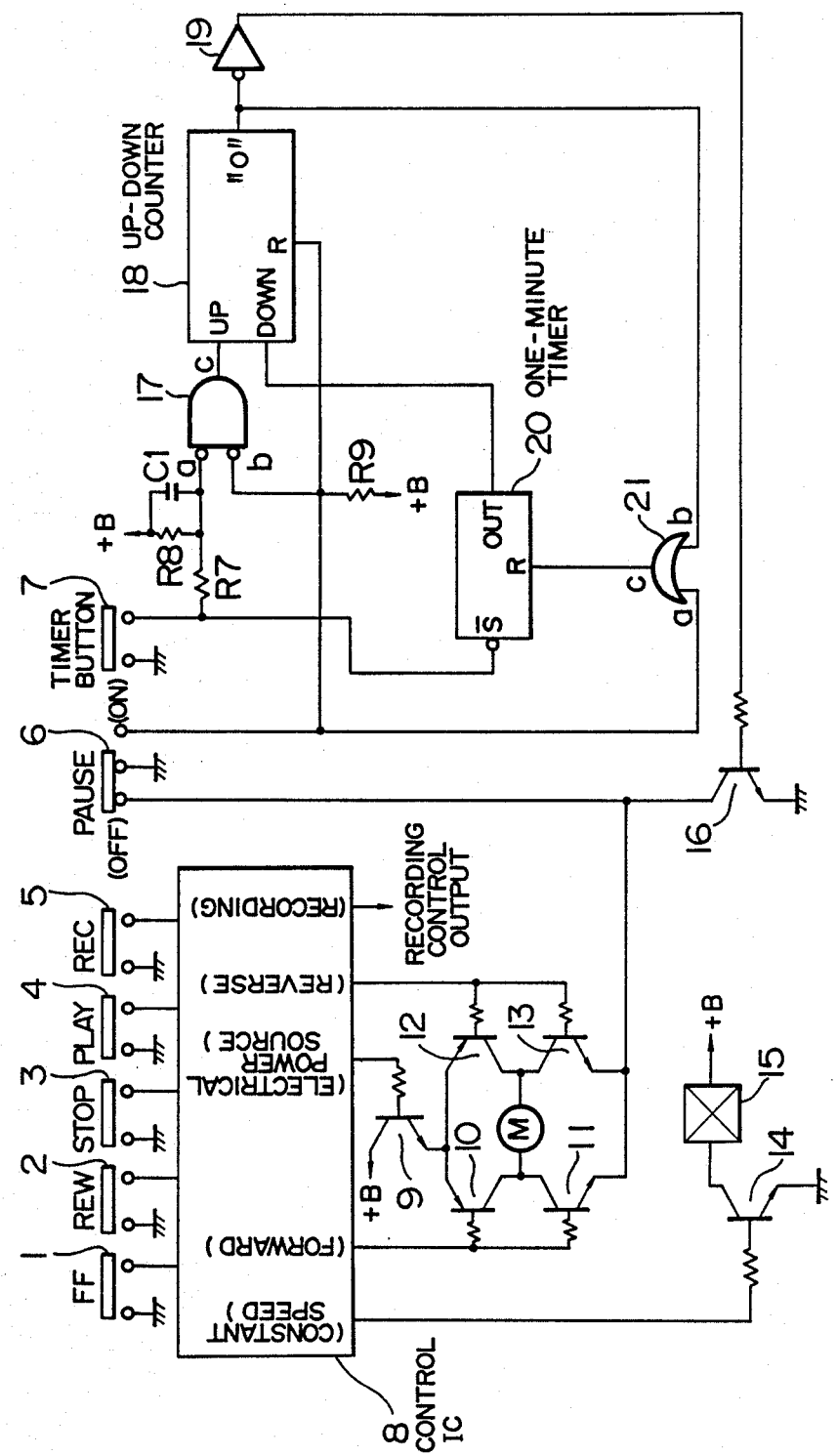
FIG. 1 is a circuit diagram showing the first embodiment of the present invention.

As shown in FIG. 1, the portable sound recorder of the first embodiment of the present invention comprises operating push button switches 1 to 5 for fast forwarding, rewinding operation, etc. which are the same as those provided in an ordinary tape recorder, and further comprises a pause switch 6 of sliding type, a push-button type timer button 7 newly added in the present invention, and a control IC 8 for producing specific outputs corresponding to the ON or OFF conditions of the respective operating push button switches 1 to 5 described above. For example, when the operating push button switch 4 (PLAY) is depressed, assuming that a power supply terminal of the control IC 8 represents H level, a switching transistor 9 connected to the power supply terminal becomes ON, and a drive circuit for a motor M constituted with transistors 10 to 13 is powered.

Further, when it is assumed that an output terminal (positive) represents an H level and an output terminal (negative) represents an L level, transistors 11 and 12 become ON, and the motor M is driven in the forward direction. Furthermore, assuming that an output terminal (constant speed) represents an H level, a transistor 14 becomes ON, and a solenoid 15 of the load is energized. A pinch roller (not shown in the figure) is pressed against a capstan (not shown) by the energization of the solenoid, and the running of the tape (not shown) is initiated at a constant speed in a forward direction. Also, there is provided a mechanism to maintain the speed constant after the running of the tape is initiated, even when the power supply to the solenoid 15 is stopped.

Also, when the pushbutton switches 4 (PLAY) and 5 (REC) are depressed at the same time, assuming that an output terminal (RECORDING) of the control IC 8 represents an H level, a recording circuit of a high-frequency bias and or like, not shown in the figure, can be powered. The tape recorder further comprises a NOR gate 17. When the pause switch 6 is turned ON, the NOR gate 17 is activated to pass a H level signal to the up input of an up-down counter 18 each time the timer pushbutton switch 7 is enabled.

The counter 18 thus effects upcount of the number of depressing operations of the timer push button switch 7 through the above-mentioned when (pause) is on NOR-gate 17. The counter 18 also effects downcount in response to an output of a one-minute timer 20 described later. This counter is so constituted and adapted that when an output terminal "0" of the counter is at an H level, the timer 20 is placed in the state of count number zero, or in the reset state. The one-minute timer 20 outputs one pulse every minute. In the state where its reset terminal R is at the level L (in the state where the pause switch 6 is in the ON state), when it is assumed that a start terminal S is instantaneously at the L level in response to the depressing operation of the timer push button switch, the timer is started and one pulse is output from the output terminal OUT until resetting is carried out, this pulse being applied to a DOWN terminal of the up-down counter 18. Reference numeral 21 designates an OR-gate.

Next, in connection with a concrete description of the operation, the state wherein the tape has not yet reached its end will be first described. When the soft-touch pushbutton switch 4 (PLAY) or the pushbutton switch 5 (REC) is depressed, as stated above, the tape (not shown) is started in the play-back or recording state, and then the pause switch 6 is turned ON. Alternatively, the pause switch 6 is first turned ON and then the pushbutton switch 4 (PLAY) or the pushbutton switch 5 (REC) described above is depressed. By turning the above mentioned pause switch 6 ON, the earth (or ground) side of the motor-drive circuit comprising the transistors 10 to 13 is disconnected, and power supply to the motor M is cut off, so that the tape (not shown) is placed in the stopped state. At the same time, the terminal b of the NOR-gate 17 shifts to H level because the pause switch is turned ON, and the NOR-gate 17 is activated. The reset states of the up-down counter 18 and the one-minute timer 20 are terminated through the resistor R9 and further through the terminals b and c of the OR-gate 21. Even though the reset states are terminated in such a manner, the count number of the up-down counter 18 is zero, and, as a result of its output of the level H through an inverter 19, the transistor 16 is in an "OFF" state. Accordingly, when a two-minute recording, for example, is required, the timer pushbutton switch 7 should be successively depressed twice. The count number of the up-down counter 18 thus becomes 2 through the activated NOR-gate 17, whereby the output terminal "0" of the counter 18 represents an L level because of the output of the counter is greater than 0. As described above, when the above mentioned counter is placed in its reset state or when the count number becomes zero, the output terminal "0" is maintained at the H level. Accordingly, in this case, since the transistor 16 becomes ON through the output terminal "0" maintained at the L level and the inverter 19, even though the pause switch 6 has been turned ON as described above, the motor-drive circuit comprising the transistors 10 to 13 becomes ON, and the motor M is driven. Therefore, the tape (not shown) which had been stopped starts running, and thus conversation and the like can be recorded on the tape through a conventional recording circuit.

Now the one-minute timer 20 whose reset state has been terminated as described above, is started when the timer pushbutton switch 7 was first pushed as stated above, and when one minute has passed, one pulse is output from the output terminal OUT. Since this pulse output is applied to the terminal DOWN of the above mentioned counter as is evident from the figure, the count number which has been "2" becomes "1". When one minute further passes, the count number becomes "0" in the same manner, and the output terminal "0" shifts to the H level from the level L. Accordingly, the transistor 16 returns again to OFF through the inverter 19. Accordingly, power to the motor M is stopped and the running of the tape is stopped. Since the one-minute timer 20 is reset by the output "0" of preferably the H level through the terminals b and c of the OR-gate 21, no pulse will be generated from this timer even after one minute.

Further, in the first embodiment of the present invention, the operating pushbutton and slide switches are of the soft-touch type, but needless to say, the present invention is also applicable to a tape recorder provided with a mechanism such as to be locked by the operating switches.

Next, the operation when a tape is at its end will be described with reference to FIG. 2.

Figure 2:
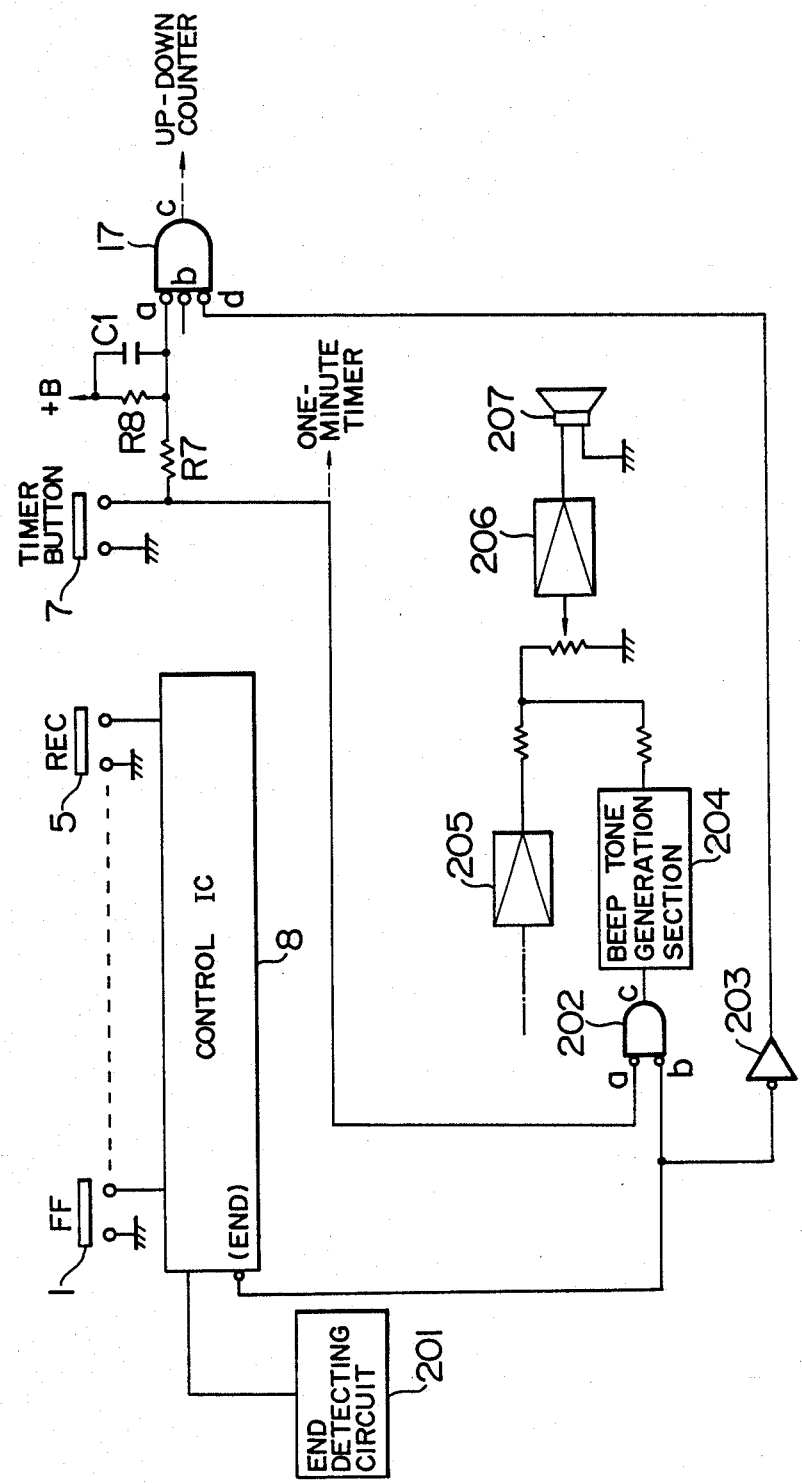
FIG. 2 is a circuit diagram for a description of the operation in the case of tape end in FIG. 1.

In FIG. 2, the circuit shown in FIG. 2 comprises a tape end detection circuit 201 capable of detecting a tape end while counting pulses generated in correspondence with the rotation of a reel holder (not shown). Also the control IC 8 described hereinbefore and shown in FIG. 1 includes an end terminal for providing a signal capable of shifting from level H to the L level when the above mentioned tape end is detected by the tape end detection circuit 200. When the end terminal allows a signal appearing thereon to shift from the level H to the level L, a NOR-gate 202 is activated and the NOR-gate 17 (the terminal d is additionally provided) as shown in FIG. 1 is deactivated through an inverter 203 and the terminal d. Accordingly, even if the timer pushbutton switch 7 is depressed with the pause switch (omitted in FIG. 2) shown in FIG. 1 being in the ON state, since the NOR-gate 17 is in the deactivated state at the tape end at this time, the up-down counter (omitted) will be subjected to no action whatsoever. If this up-down counter does not operate, the one-minute timer also shown in FIG. 1 will undergo no action whatsoever, whereby the tape in the end state will not be forcedly driven. At the same time, a beep tone generation section 204 is energized, by the depression of the timer pushbutton switch, through the above mentioned NOR-gate 202, and the generated beep tone is introduced into the input side of a main amplifier 206 and is amplified through a loud speaker SP thereby to sound an alarm.

Figure 3:
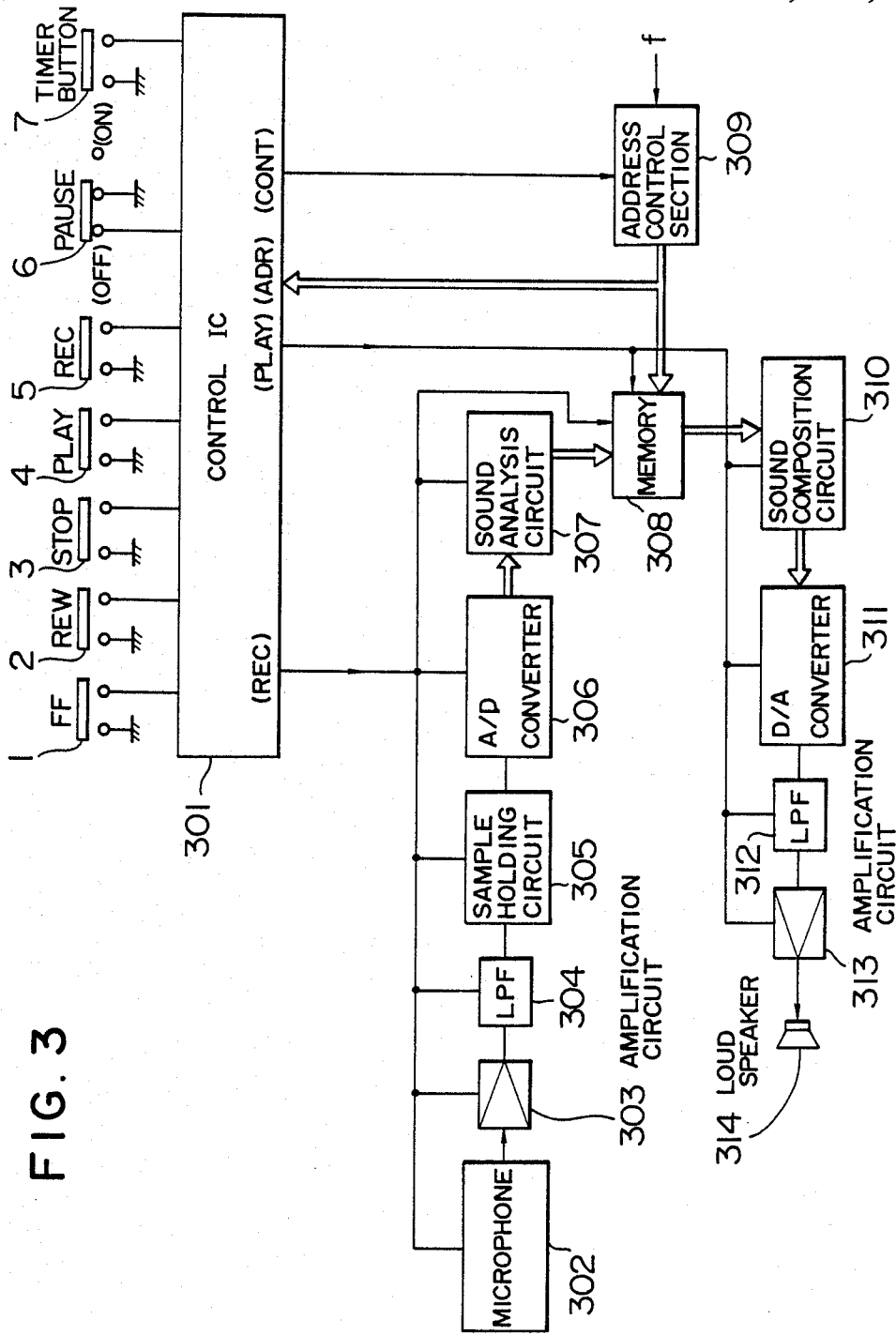
FIG. 3 is a circuit diagram showing the second embodiment of the present invention.

The second embodiment of the present invention will be describeed wherein no tape is used in the recording and play-back equipment of this embodiment. That is, a memory having no moving parts, for example, a random access memory, RAM, is utilized instead of tapes. That is, in FIG. 3, each of the control switches 1 to 7 undergoes the same action as that in FIG. 1. In this case, the rewinding switch 2 and the fast-forwarding switch 1 perform the functions of review and cue for a tape and are used for random picking up of the recorded contents from a tape while any contents recorded in a memory are being heard with a rapid flow of speech.

A control IC 301 has a terminal (ADR) capable of receiving any address information forwarded from an address control section 309 described later. ON the basis of this information, the end of memory can be detected. Also, when the recording pushbutton switch 5 is depressed, the terminal (REC) produces an output of the H level. When any play-back group control pushbutton switch, that is, any pushbutton switch among the play-back pushbutton switch 4, the fast-forwarding push button switch 1, and the rewinding pushbutton switch 2 is depressed, an output is so taken out from a flip-flop (not shown) included in the above mentioned control IC 302 that the terminal (PLAY) the represents H level, and control for recording or play-back is performed by a memory described later. Also the terminal (CONT) starts recording or play-back operation and performs stoppage control according to its output which is output through an address control section 309 described later.

The recorder further comprises a microphone 302, an amplifier circuit 303, and a low-pass filter 304 to restrict the sound frequency band to a specified range. The recorder further comprises a sample holding circuit 305, an A/D converter 306 for converting a sound which has undergone sample-hold into digital information with a specified number of bits, a sound analysis circuit 307 represented by an ADPCM system or the like, and a memory 308. Furthermore, the recorder comprises an address control section 309 which is controlled by; a sampling frequency and is further controlled by the output (CONT) of the control IC 301 to forward or stop the above mentioned memory address, a sound composition circuit 310 represented by the above mentioned ADPCM, a D/A converter 311 for converting digitalized sound into an analog signal as described above, a low-pass filter (LPF) 312, an amplifier circuit 313, and a loudspeaker 314.

In the recording and play-back equipment configured as described above, when the recording pushbutton switch 5, for example, is depressed, a signal of the H level is output from the terminal (REC) of the control IC, and the recording circuit is activated from the microphone 302 through the sound analysis circuit 307. Further the memory 308 is placed in writing state, and writing-in into the memory 308 starts from the first address specified by the address control section 309 in which sound input to the microphone is switched by the sampling frequency f. Then, when the pause switch 6 is activated, the output of the address control 309 is stopped by a control signal (for example, signal of L level) incoming from the terminal (CONT). Accordingly, the writing operation of the memory 308 will be stopped at a certain address. Next, when recording is required, for example, two minutes as in the case of the tape described hereinbefore, the timer bushbutton switch 7 is depressed successively twice. As a result, a signal of H level is output for two minutes from the terminal (CONT) of the control IC 301, and the address control section 309 of which operation has been stopped is activated, whereby writing-in operation of the memory 308 is carried out for two minutes.

Furthermore, on the basis of the address information of the address control section 309, the end of memory can be detected through the input terminal (ADR) of the control IC, and the recording operation is stopped at this end. Further, when the timer pushbutton switch 7 is depressed at this end, since the beep tone can be magnified by the loud speaker 314 as shown in FIG. 2, it is indicated that recording or play-back cannot be further continued.

The control IC, the up-down counter 18, the one-minute timer 20, etc., in the above described example of practice can be substituted by a microcomputer.

Figure 4:
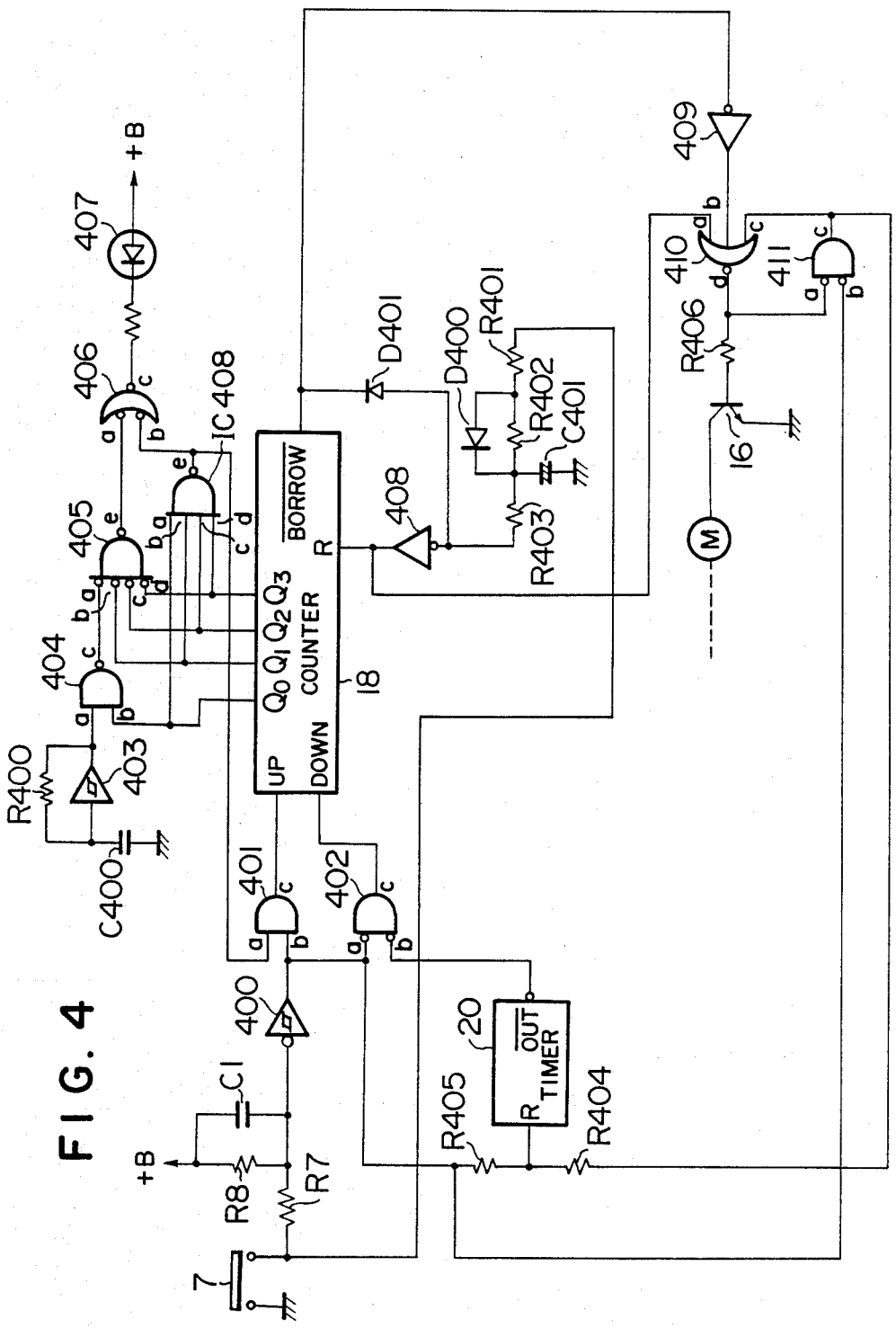
FIG. 4 is a circuit diagram showing the third embodiment of the present invention.

A third embodiment of the present invention will be now described with reference to FIG. 4. The circuit shown in this figure is configured so that when the count value of the up-down counter 18 reaches the maximum value (15, in this embodiment), by manual operation of timer pushbutton 7 a light emitting diode (LED) 407 is continuously turned on to give a warning to an operator. In another aspect of this circuit, when the LED 407 is continuously turned on, even if the timer push-button 7 is continuously depressed so many times that the count value of the up-down counter 18 exceeds the maximum value, the count value of the up-down counter 18 is maintained at the maximum value and fixed thereto. In a further aspect of this circuit, while the recording operation of the recorder is effected through the counter as described above, before one minute from time at which the tape recorder will be stopped, namely, when the down count value of the above-mentioned counter has reached "1", the LED 407 effects blinking operation to give a warning to an operator. In this instance, when the blinking of the LED 407 is initiated, a predetermined number of depressing operations of pushbutton switch 7 is conducted, thereby enabling further prolongation of timer expiration time.

The detail of the circuit according to this embodiment will be now described below. The up-down counter 18 used has parallel outputs Q0, Q1, Q2 and Q3 of 4 bits for reading count values. From the BORROW terminal, a negative pulse is output when the down count value reaches zero. A Schmitt circuit 403 produces an oscillating signal having a frequency of 2 Hz determined by the time constant based on a resistor R400 and a capacitor C400. Thus, the Schmitt circuit 403 is used for turning on and off the above-mentioned LED 407, which operation will be discussed in greater detail later. Gate ICs 404 and 405 are used to detect the count value "1" of the counter 18. In addition, a gate IC 408 is used to detect the maximum count value (15 in decimal notation).

When the circuit in this embodiment is powered, for a time period (about one second) during which a capacitor C401 is charged to a predetermined value through the power supply +B, the resistors R8 and R7, a resistor R401, and a diode D400, an inverter 408 represents L level on its input side and H level on its output side. Accordingly, the counter 18 is reset and the count value thereof is equal to zero. In this instance, when the output of the inverter 408 shifts momentarily to the H level, an input terminal a of an NOR gate 410, an output terminal d thereof and an input terminal a of a NOR-gate 411 shift to H level, L level and L level, respectively. Since the other input terminal b of the NOR gate 411 is caused to be at the L level by the output of the Schmitt inverter 400, an output terminal c of the NOR-gate 411 is maintained at the H level. This output H level is applied to an input terminal c of the NOR gate 410, thus maintaining the ouput terminal d of the NOR gate 410 at the L level. When the output of the NOR gate 410 represents the L level, a bias is not applied to the transistor 16 through a resistor R406, which the result that the transistor 16 is in a cutoff state. As previously described, when the transistor 16 is off, the tape recorder is not operated.

Then, when the timer push-button switch 7 is repeatedly depressed for permitting the tape recorder to be operative, the up count terminal UP of the counter 18 is caused to be at the H level through the Schmitt inverter 400 and the AND gate 401 every depressing operation. Thus, the counter 18 effects up-count of the number of depressing operations of the timer push-button switch 7. At this time, if the up count value is "1" at the beginning of operation of timer button 7, output terminals of counter 18, "Q0, Q1, Q2, Q3" become "H, L, L, L", and then NAND gate 404 and OR gate 405 are activated, so that LED 407 is flickered with a 2 Hz interval by a multivibrator incorporated with Schmitt inverter 403. When the number of depressing operations reaches 15, the outputs Q0, Q1, Q2 and Q3 of the counter 18 all shift to the H level and these H level outputs are delivered to all input terminals a to d of the NAND gate 408. As a result, an output terminal e of the NAND gate 408 is maintained at the L level, thus to continuously turn on the LED 407 through the terminals b or d of the AND gate 406. At the same time, when the output of the NAND gate 408 shifts to the L level, the input terminal a of the AND gate 401 also shifts to the L level, thus allowing the AND gate 401 to be inactive. Accordingly, as long as the counter 18 maintains the maximum value, the up count input is blocked by the AND gate 401 irrespective of the number of depressing operations of the timer push-button switch 7. For this reason, there is no possibility that the count value is returned to zero independent of how many times the push-button switch 7 is depressed after the LED is turned on, thus making it possible to prevent the tape recorder from inconveniently being stopped although not required to be stopped.

On the other hand, when the timer pushbutton 7 is depressed even once, the input terminal b of the NOR gate 411 shifts from the L to H level through the Schmitt inverter 400 and hence its output terminal c shifts from the H to L level. As a result, as apparent from the foregoing description, the output of the NOR gate 410 is switched to H level to the turn on the transistor 16, thus to initiate recording operation of the tape recorder.

The one minute timer 20 used in this embodiment has a circuit construction different from those of the above-mentioned embodiments. Namely, this timer 20 is configured so that when a voltage is applied to the reset terminal R through a resistor R404 or R405, it is reset, while when not applied thereto, it initiates the timer operation to output a negative pulse from the output terminal $\overline{OUT}$ every one minute. Accordingly, simultaneously with the start of the recording operation of the tape recorder, the operation of the one-minute timer 20 is initiated and the negative pulse occurring each minute is applied to the down count terminal DOWN through the AND gate 402. Thus, the counter 18 effects down count operation.

When the down count value reaches "1" after a predetermined time elapses, the outputs "Q0", "Q1", "Q2" and "Q3" of the counter 18 become H, L, L and L, respectively, thus to raise the input terminal b of the NAND gate 404 to the H level. Thus, the NAND gate becomes active and the output i.e. signal having frequency of 2 Hz of the Schmitt inverter (multivibrator) 403 appears on the side of the output terminal c of the NAND gate 404. When this output represents the L level, it further appears on the side of the output terminal e of the OR gate 405, thus allowing the LED 407 to blink at a 2 Hz cycle through the AND gate 406.

If the recording time elapses after only one minute and is considered to be insufficient, a predetermined number of depressing operations of the timer push-button switch 7 permits the timer operation to be prolonged in proportion to the number of depressing operations. Thus, the blinking operation of the LED 407 will be automatically released since the count value does no become equal to "1".

If there is no further operation with the LED being blinking, the count value becomes equal to zero after one minute, and a pulse of L level is output from the output terminal $\overline{BORROW}$ of the counter 18. This pulse causes the input terminal b of the NOR gate 410 to be at the H level through the inverter 409, thereby allowing the output terminal d thereof to be at the L level. As a result, the transistor 16 is cut off, so that the tape recorder is stopped. Thus, once the above-mentioned output terminal d becomes at the L level, this state is held through the NAND gate 411 as previously described.

On the other hand, there are instances where it is required to stop the recorder before the count value is equal to zero, as in the second embodiment, during the operation of the tape recorder. In such instances, when the timer push-button switch 7 is continuously depressed for more than two seconds, an electric charge stored in the capacitor C401 is discharged through the resistors R401 and R402. Since this permits the counter 18 to be reset through the inverter 408, the count value is forced to zero, thus making it possible to release the recording operation of the recorder.

Heretofore, there have been instances wherein, a portable recorder has been placed in a pocket of a user with the pause switch in the OFF state, and the user has inadvertently forgotten to stop the operation of the recorder, whereby the tape or recording medium has reached its end or battery may be exhausted without the user being aware of this state. Thus, when the user suddenly wishes to operate the recorder for the purpose of secret recording and reproducing during a short period in his pocket, he finds that he cannot do so because tape or other storage medium is ended or battery is exhausted already. This invention overcomes this problem and makes possible efficient secret short-time recording and play-back.

The present invention originally relates to an application of a new timer means which is disclosed in U.S. Pat. No. 4,540,851. More particularly, according ot U.S. Pat. No. 4,540,851, one operation of a timer push-button is preset for 30 minutes, while according to the present invention said one operation is preset for one minute. Although U.S. Pat. No. 4,540,851 was submitted as only for a VTR, it is understandable that the present invention will be applied not only to a recorder but also to other pocket size equipment with small battery capacity, such as a transistor radio or the like.

What is claimed is:

1. A portable sound recorder and playback device having a motor circuit for driving a recording medium, the device comprising:
   first manual pushbutton switches for controlling recording and playback modes of operation of the device;
   a second manual pushbutton switch which is provided to operate only said motor circuit temporarily in the recording and play-back modes of the device;
   a first circuit means for temporarily energizing or de-energizing said motor circuit;
   a timer for timing a predetermined time increment;
   activating means for activating said first circuit means; and
   a second circuit means being responsive to said timer and having counting means for counting a number of operations of said second manual pushbutton switch and means for operating said activating means for a predetermined time period corresponding a function of said predetermined time increment and the number of operations of said second pushbutton switch counted by said counting means.

2. A portable sound recorder and playback device as claimed in claim 1 in which said second circuit means includes a memory means which stores a signal from said second pushbutton switch so as to operate said activating means for said predetermined time period.

3. A portable sound recorder and playback device as claimed in claim 2 in which said memory means comprises an up-down counter which is incremented by a signal from said second pushbutton switch each time said second switch is operated and is decremented by a signal from said timer wherein said activating means is operable for a predetermined time period corresponding to a function of the number of operations of said second pushbutton switch and the predetermined time increment.

4. A portable sound recorder and playback device as claimed in claim 3, wehrein said up-down counter includes means for limiting a maximum count thereof to a particular maximum count and a locking circuit which locks the up-down counter on the maximum count even if the number of operations of said second pushbutton switch exceeds said maximum count.

5. A sound recorder as claimed in claim 2, including means for measuring a time duration while the pushbutton switch is operated and means responsive to said measuring means for (1) resetting said memory means to a count value of zero when the pushbutton is depressed and held for a couple of seconds, (2) terminating timing by said timer means and (3) stopping any storage medium operation.

6. A portable sound recorder and playack device as claimed in claim 1, in which said second circuit means includes a visual indicating means which indicates that a time remaining for recording corresponds to less than one count from a zero count of said counting means.

7. A portable sound recorder and playback device as claimed in claim 1, including means for detecting a capacity of recordation of a recording medium and in which said second circuit means includes an alarm means which is activated when said recording medium is recorded up to its full capacity and said second manual pushbutton switch is operated.

8. A portable recorder and playback device having a motor circuit for driving a recording medium, the device comprising:
first manual pushbutton switches for controlling recording and playback modes of operation of the device;
a second manual pushbutton switch provided to operate only said motor circuit in the recording and play-back modes of said device;
a first circuit means for temporarily energizing or deenergizing, said motor circuit;
a timer for generating timing signals having a predetermined time duration;
activating means for activating said first circuit means for a predetermined time period;
up/down counter means incremented by operations of said second manual pushbutton switch and decremented by said predetermined time duration signals for indicating at least one of the beginning and end of said predetermined time period, and
a flickering means responsive to said up/down counter means for visually displaying said at least one of the beginning and the end of said predetermined time period.

9. A portable sound recorder and playback device as claimed in claim 8, in which said up/down counter means includes means for upcounting a signal from said second pushbutton switch and downcounting a signal from said timer, said up/down counter being thereby operable for a certain time period corresponding to the number of operations of said second pushbutton switch.

10. A portable sound recorder and playback device as claimed in claim 8, in which said flickering means includes a detection circuit for detecting least significant output bits generated by said up/down counter.

11. A portable sound recorder and playback device as claimed in claim 8, in which said flickering means further includes:
a flickering circuit for generating a flickering signal; and
a light-emitting means which operates to emit light in response to said up/down counter and said flicker circuit.

12. A portable sound recorder and playback device having a motor circuit for driving a recording medium, said device comprising:
first manual pushbutton switches for controlling recording and playback modes of operation of the device;
a second manual pushbutton switch for operating only said motor circuit in a recording mode or a playback mode of the device;
first circuit means for temporarily energizing or deenergizing said motor circuit;
counter means for activating said first circuit means for a predetermined time period;
means for indicating at least one of the beginning and end of the predetermined time period; and
means responsive to said indicating means for displaying visually said at least one of the beginning and end of said predetermined time period.

* * * * *